United States Patent

Brugge

[11] Patent Number: 5,958,193
[45] Date of Patent: Sep. 28, 1999

[54] SPUTTER DEPOSITION WITH MOBILE COLLIMATOR

[75] Inventor: Hunter Barham Brugge, San Antonio, Tex.

[73] Assignee: VLSI Technology, Inc., San Jose, Calif.

[21] Appl. No.: 08/190,622

[22] Filed: Feb. 1, 1994

[51] Int. Cl.[6] .................................................. C23C 14/34
[52] U.S. Cl. ............................. 204/192.13; 204/192.12; 204/298.03; 204/298.11
[58] Field of Search ..................... 204/192.12, 298.03, 204/298.11, 192.13

[56] References Cited

U.S. PATENT DOCUMENTS

| | | | |
|---|---|---|---|
| 3,904,503 | 9/1975 | Hanfmann | 204/298.11 X |
| 3,939,052 | 2/1976 | Riley | 204/298.11 X |
| 4,022,939 | 5/1977 | Roth et al. | 427/251 |
| 4,051,010 | 9/1977 | Roth et al. | 204/298 |
| 4,062,319 | 12/1977 | Roth et al. | 118/49 |
| 4,302,311 | 11/1981 | Lowe et al. | 204/192 |
| 4,315,960 | 2/1982 | Ohji et al. | 204/298.11 X |
| 4,562,093 | 12/1985 | Mario et al. | 204/298.11 X |
| 4,717,462 | 1/1988 | Homma et al. | 204/298.06 X |
| 4,724,060 | 2/1988 | Sakata et al. | 204/298.11 |
| 4,824,544 | 4/1989 | Mikalesen et al. | 204/298 |
| 5,154,730 | 10/1992 | Hodos et al. | 29/25.01 |
| 5,171,412 | 12/1992 | Talieh et al. | 204/298.11 X |
| 5,223,108 | 6/1993 | Hurwitt | 204/298.11 X |

FOREIGN PATENT DOCUMENTS

| | | | |
|---|---|---|---|
| 0440377 | 8/1991 | European Pat. Off. | 204/298.11 |

*Primary Examiner*—Nam Nguyen
*Attorney, Agent, or Firm*—Clifton L. Anderson

[57] ABSTRACT

A sputter deposition system includes a mobile collimator. The collimator can be magnetically moved into and out of a position between a wafer and a target of material to be sputtered onto the wafer. In addition, magnets are used to levitate the collimator so that it can be removed without solid-solid friction, and the contamination it can cause. The magnets used for levitation are part of a control loop that maintains the orientation of the collimator parallel to the wafer. The system allows for a combination of good deposition step coverage and high fabrication throughput while minimizing opportunities for contamination and breakage that can occur when the wafer is transferred between chambers.

7 Claims, 5 Drawing Sheets

SPUTTER DEPOSITION WITH MOBILE COLLIMATOR

BACKGROUND OF THE INVENTION

The present invention relates to integrated circuit fabrication and, more particularly, to sputter deposition systems. A major objective of the present invention is to provide for improved yields and throughput for submicron processing technologies.

Much of modern progress is associated with the increasing miniaturization of integrated circuits made possible by advances in semiconductor processing technology. Specifically, the miniaturization has been made possible as photolithographic techniques have permitted smaller features to be defined. Not long ago, 2 and 3 micron features were the minimum; today, state-of-the-art procedures permit submicron features to be defined.

In a typical fabrication method, transistor active regions are defined by doping a silicon substrate. Local interconnects and gates (for MOS technology) are defined by patterning polysilicon over the substrate. Devices so defined are integrated by a metal interconnect structure. This metal interconnect structure is typically insulated from the underlying transistors by a silicon dioxide layer. Metal vias, e.g., tungsten-titanium barrier and aluminum-copper conductors, can extend through the insulator to provide the desired electrical connections between the metal interconnect structure and the underlying transistors.

The metal vias can be formed by opening apertures through the insulator and sputtering metal so that the via apertures are filled. Sputtering involves bombarding a target of the material to be deposited with ions from a heavy gas plasma. Through momentum transfer, atoms near the surface of the target material are ejected. Atoms having a suitable trajectory are deposited on the wafer on which integrated circuits are being defined.

Generally, the sputtered atoms are deposited on the top surface of the wafer, at the base of apertures, and on aperture sidewalls. Material deposited on the aperture sidewalls can occlude the aperture base. This occlusion is negligible when the aperture aspect ratio, i.e., the ratio of the aperture height to the aperture cross section, is small. However, to achieve maximal circuit densities, aperture cross sections have decreased to the extent permitted by advances in photolithography. Aperture heights are bounded from below by the requirements for forming a satisfactory insulator layer. Thus, aspect ratios have been increasing to the point where sidewall depositions can prevent satisfactory electrical connections at the aperture base.

This problem is addressed by minimizing sidewall depositions until sufficient material has been deposited on the aperture base, effectively lowering the aperture aspect ratio. Sidewall depositions can be minimized by collimating the material approaching the wafer. To this end, a grating is interposed between the sputter target and the wafer. Atoms with oblique trajectories are captured by the grating, while most of the atoms with trajectories orthogonal to the wafer are allowed to reach the wafer. The orthogonal trajectory that allows atoms through the grating also favors deposition at the aperture bases as opposed to the aperture sidewalls. Thus, adequate electrical contacts at the via aperture bases are formed.

Collimation filters out many atoms that would otherwise be deposited on the wafer, and thus adversely affects the deposition rate. More time is required to achieve a desired deposition thickness so that processing throughput is reduced. This throughput reduction adds substantially to the cost of the completed integrated circuit. To enhance throughput, collimated sputtering can be terminated once aperture aspect ratios are sufficiently reduced that the sidewall occlusion resulting from subsequent uncollimated sputtering would not be a problem. The wafer is then transferred to a sputter chamber without a collimator for a relatively rapid completion of the deposition.

Each transfer between chambers incurs its own delay and risks of wafer breakage and contamination. These problems are minimized by multi-chamber machines that provide for automated and sealed wafer transfers. However, the number of chambers per machine is limited so at some point an addition transfer requires a transfer between machines. These intermachine transfers are more time consuming and more prone to contamination and breakage.

While the increased throughput of a two-step sputter deposition can outweigh the disadvantages of the additional transfer, it would be desirable to obtain the advantages with reduced tradeoffs. What is needed is a sputtering system that provides satisfactory aperture base coverage and reasonable sputtering throughput, while minimizing wafer transfers.

SUMMARY OF THE INVENTION

The present invention provides a sputtering system with a mobile collimator. The collimator is initially positioned between the target and the wafer; the orientation of the collimator can be adjusted so that it is parallel to the wafer. Collimated sputtering proceeds with the properly oriented collimator in its collimating position. The collimator is removed and sputter deposition resumes without collimation. Thus, the desired via profile and high throughput can be achieved without an intermediate wafer transfer.

Magnetic drive and levitation are provided to minimize contamination. Contamination can result when accumulations of material on the collimator are unintentionally dislodged and when mechanical friction dislodges foreign materials. To this end, permanent magnets are rigidly coupled to the collimator. Electromagnets are used to manipulate the collimator by attracting and repelling the permanent magnets. Thus, mechanical linkages to the collimator are not required. In addition, magnetic forces can be used to levitate the collimator to minimize contamination by particles that would otherwise be dislodged by friction movement at the interface between solid surfaces.

Collimator orientation is critical to obtain the desired sputtering directionality. Collimator orientation can be maintained mechanically. Alternatively, the orientation of a levitated collimator can be regulated by monitoring orientation and adjusting orientation accordingly.

Collimator orientation can be optically monitored. To this end, laser diodes can provide light that is guided to the collimator by optical fibers. Depending on the orientation of the collimator, some light is returned by optical fibers to detectors. The detector outputs collectively indicate any misorientation of the collimator. A controller then uses the readings to adjust orientation, for example, by changing the levitating electromagnetic fields.

Accordingly, the present invention provides for both collimated and uncollimated sputtering in the same chamber. This can be accomplished without mechanical friction and vibrations that can cause contamination. Orientation control can ensure orthogonality of collimated atoms, and thus satisfactory deposition at aperture bases minimally occluded by sidewall deposition. These and other features and advantages of the present invention are apparent from the description below with reference to the following drawings.

DESCRIPTION OF THE PREFERRED EMBODIMENTS

Figure 1:
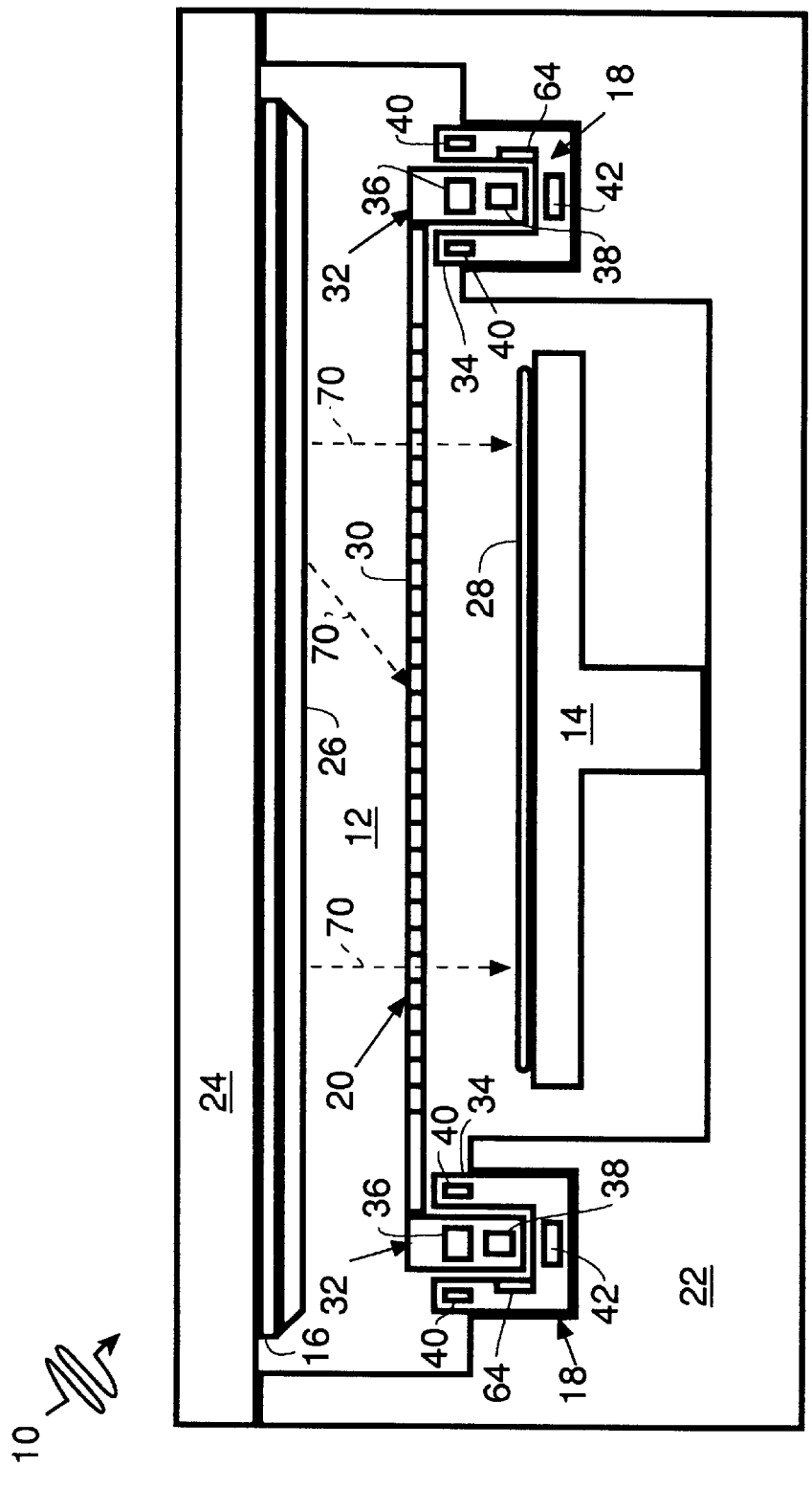
FIG. 1 is a schematic sectional view of a sputter deposition system in accordance with the present invention.

In accordance with the present invention, a sputtering system 10 comprises a sputtering chamber 12, a wafer lift 14, a backing plate 16, a track assembly 18, and a collimator assembly 20, as shown in FIG. 1. Chamber 12 includes a base 22, and a top 24. A tungsten-titanium target 26 is mounted on backing plate 16, which in turn is mounted on chamber top 24. A wafer 28 on which the material is to be deposited is supported by lift 14.

Collimator assembly 20 includes a collimator grating 30 and runners 32. Track assembly 18 provides guides 34 for runners 32. Positioning, orientation, and securing of collimator assembly 20 are implemented magnetically, thereby avoiding friction between solid structures that might otherwise generate particulate contamination. To this end, runners 32 include lateral permanent magnets 36 and vertical permanent magnets 38, while guides 34 include lateral electromagnets 40 and vertical electromagnets 42. The lateral permanent magnets are oriented so that north faces inward toward the wafer and south faces outward. The vertical permanent magnets are oriented with north facing up and south facing down.

Figure 2:
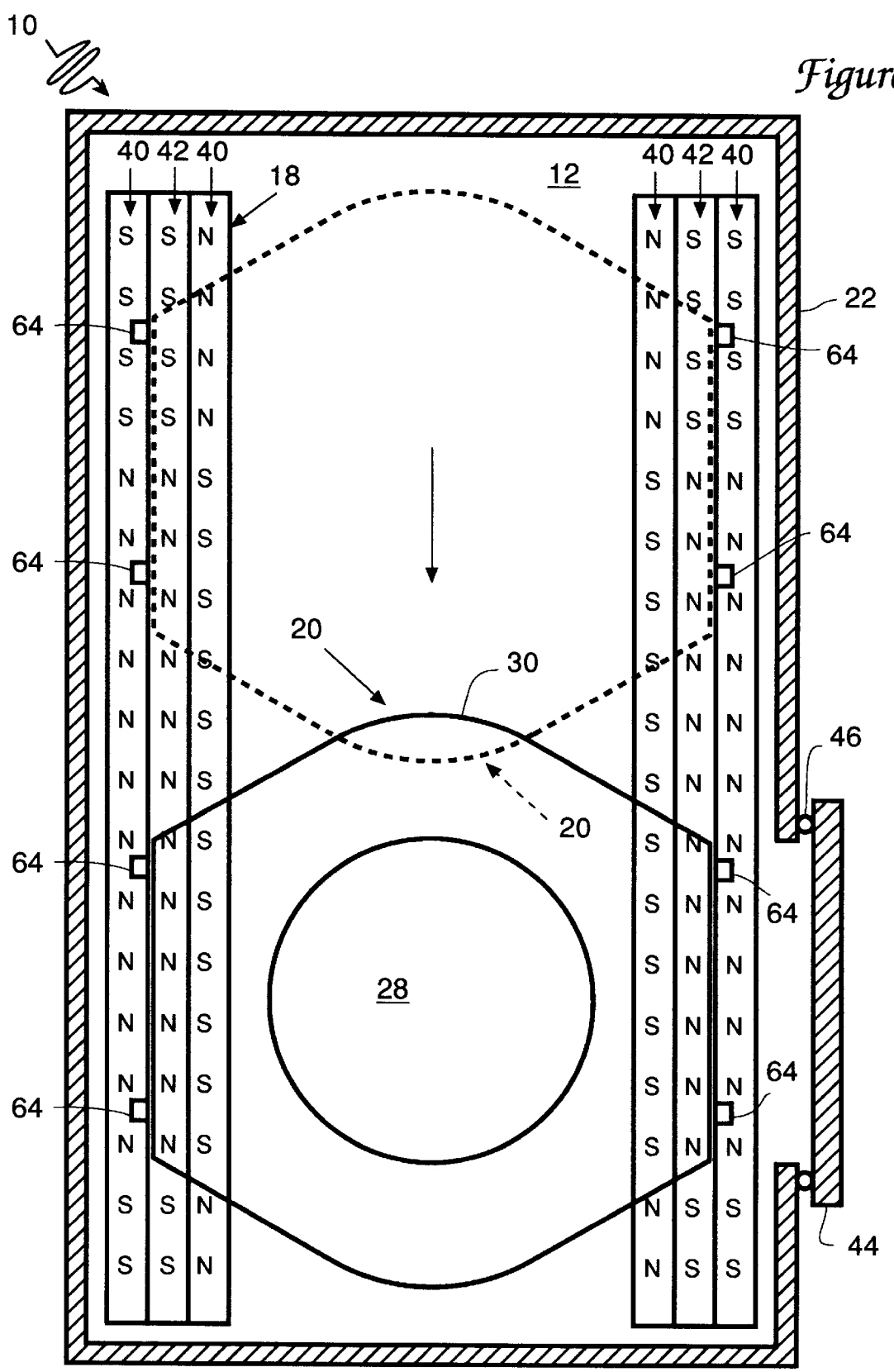
FIG. 2 is a schematic plan view of drive components of the sputter deposition system of FIG. 1.

As shown in FIG. 2, collimator grating 30 is roughly hexagonal. Runners 32 are on opposite sides of the collimator, parallel to guides 34. Permanent magnets 36 and 38 extend along the length of runners 32. Electromagnets 40 and 42 are arranged in two longitudinally extending series per runner 32.

Collimator assembly 20 is shown in its collimating position in FIG. 2, in which the noncollimating position is shown in ghost. Movement of collimator assembly 20 is controlled by the relative polarities of lateral electromagnets 40 and lateral permanent magnets 36. Lateral electromagnets toward the front and in front of (as defined by the desired direction) the collimator assembly pull it, while those toward the rear and in back of the collimator assembly push it.

The orientations of individual electromagnets are changed as the collimator assembly 20 moves; the orientations indicated in FIG. 2 are selected to move collimator assembly 20 from its noncollimating position to its collimating position. Braking is also applied magnetically by having electromagnets in front of collimator assembly 20 repel it. Once it is stopped, it is held in position by having all lateral electromagnets 40 repel; those near the front and back are adjusted to repel more strongly than those near the center position.

Figure 3:
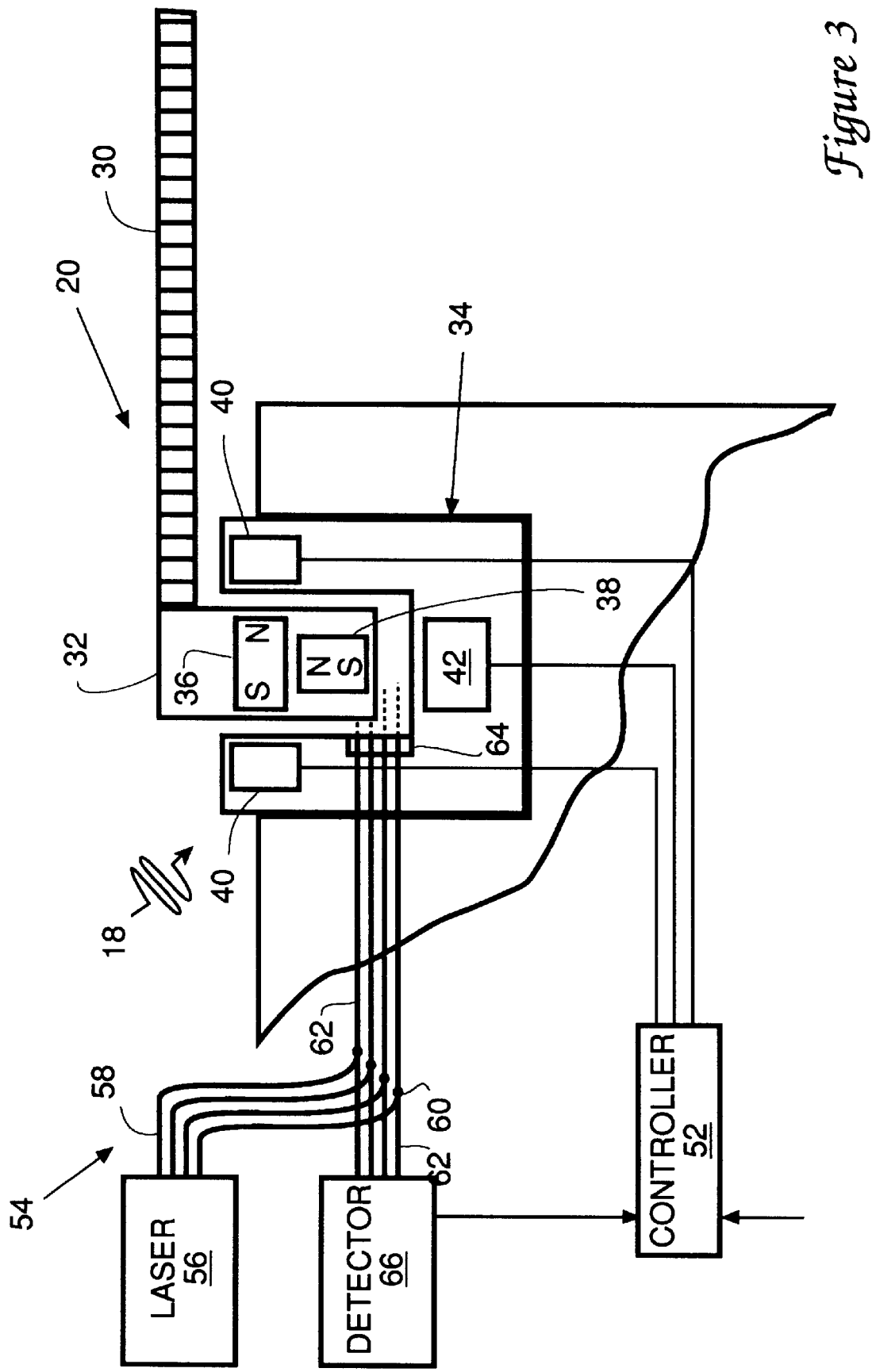
FIG. 3 is a schematic view of a positioning subsystem of the system of FIG. 1.

Vertical electromagnets 38, shown in FIGS. 1 and 3, are used to control the heights of the both ends of each runner 32. Thus, the orientation of collimator grating 30 can be controlled so that it is level during movement and so that it is parallel to wafer 28 during collimated sputtering. Sputtering system 10 alternatively allows collimator assembly 20 to be gently lowered onto guides 32 in the collimating position. A gate valve 44 through which wafer 28 was inserted into chamber 12 is shown in FIG. 2, along with a seal 46 therefor.

Vertical and horizontal position is controlled by a positioning subsystem 50, shown in FIG. 3. Positioning subsystem 50 comprises a controller 52, all electromagnets 40 and 42, and eight position monitors 54, one of which is shown in FIG. 3. Each position monitor includes a light source 56, transmitting optical fibers 58, directional couplers 60, return fibers 62, a fiber optic interface 64, and a photodetector bank 66. The positions of the eight fiber optic interfaces 64 are shown in FIG. 2.

Light source 56 is a bank of four laser diodes that provide intense monochromatic light. This light is transmitted along fibers 58 to directional couplers 60. Directional couplers couple the light into respective return fibers 62 so that the light is transmitted toward interface 64 and not toward photodetector bank 66. Light arriving at interface 64 exits the return fibers. Depending on the local level of runner 32, exiting light is reflected back into a return fiber or it is not. With the runner positioned as indicated in FIG. 2, reflected light is received by the top two return fibers, but not by the bottom two fibers. The light returned by the top two return fibers is detected by photodetector bank 66. Photodetector bank 66 provides a positive indication for the top two return fibers and a negative indication for the bottom two return fibers.

Controller 52 receives level indications from all eight photodetector banks. Interfaces 64 are positioned so that at least one photodetector of at least one transverse pair of photodetector banks 66 provides a positive indication for all positions of collimator assembly 20. At least two transverse pairs of positive indications are provided at the collimating and noncollimating positions.

When collimator assembly 20 is in the collimating position, four sets of positive level indications are received by controller 52. These are compared to determine the orientation of collimator assembly 20. The currents to the respective vertical electromagnets 42 are adjusted to provide the desired orientation for collimator grating 30. Preferably, all four indications should have the top two indications positive and the bottom two negative. Thus, positioning subsystem 50 ensures that collimator grating 30 is parallel to wafer 28 during collimated sputtering.

In the case that collimator assembly 20 rests on guides 34, the proper orientation of collimator grating 30 is ensured mechanically. Position monitors 54 are used to maintain a level orientation of collimator assembly 20 during levitation and set-down to minimize the release and dispersal of contaminants.

Figure 4:
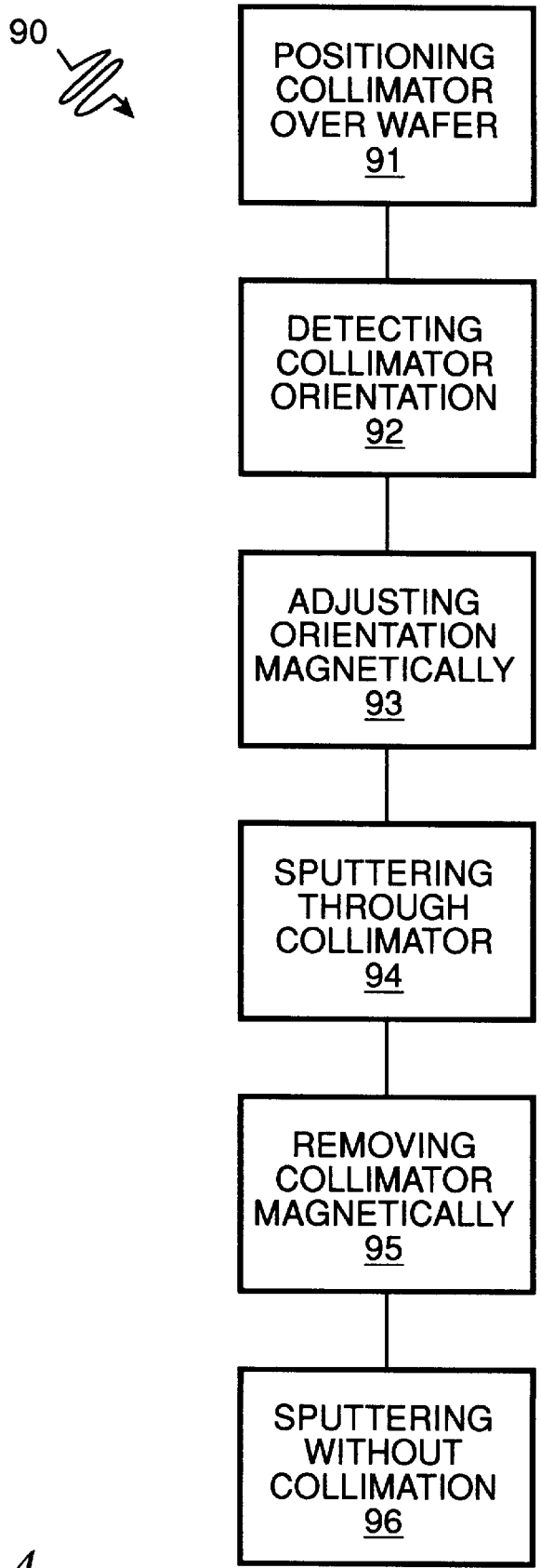
FIG. 4 is a flow chart of a method of the present invention practiced using the system of FIG. 1.

Sputtering system 10 provides for implementation of a sputtering method 90, flow charted in FIG. 4. In a step 91, collimator assembly 20 is magnetically positioned between target 26 and wafer 28. At step 92, the orientation of collimator assembly 20 is detected. At step 93, any necessary adjustments to orientation are made. At step 94, target material is deposited by sputtering through collimator assembly 20. After sputtering is interrupted, collimator assembly 20 is removed at step 95. With collimator assembly 20 no longer between target 26 and wafer 28, sputtering is resumed at step 96.

Figure 5:
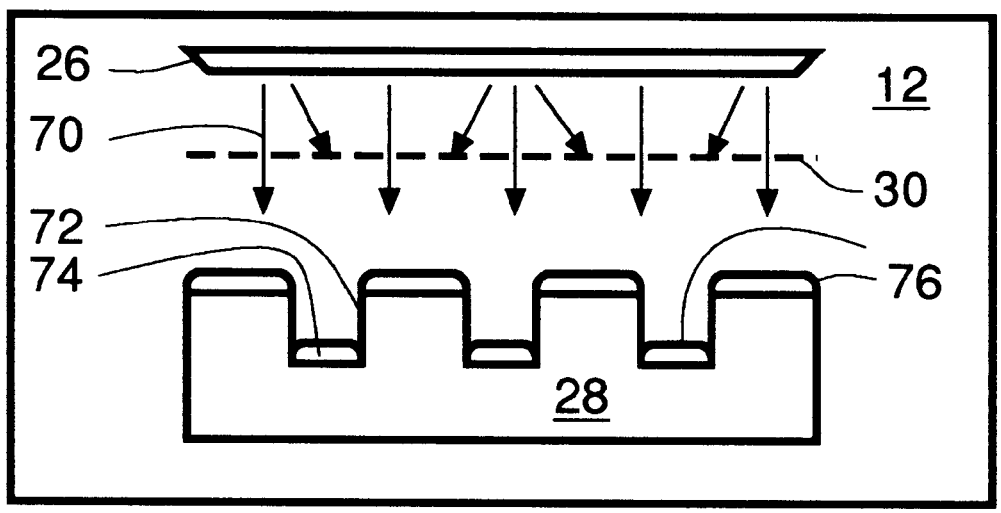
FIG. 5 is a schematic illustration of a collimated sputtering step of the method of FIG. 4.

The effect of the collimated sputtering of step 94 is indicated in FIG. 5. As indicated by the arrows 70, collimator grating 30 blocks a disproportionately large percentage of sputtered atoms with oblique trajectories. Atoms deposited on wafer 28 arrive with predominantly vertical trajectories so that aperture sidewalls 72 remain relatively free of deposited material. Aperture bases 74 are thus given a better opportunity to build up features with good integrity. Once the deposited material 76 is of sufficient thickness at aperture bases 74, collimated sputtering is halted and collimator assembly 20 is removed at step 95.

Figure 6:
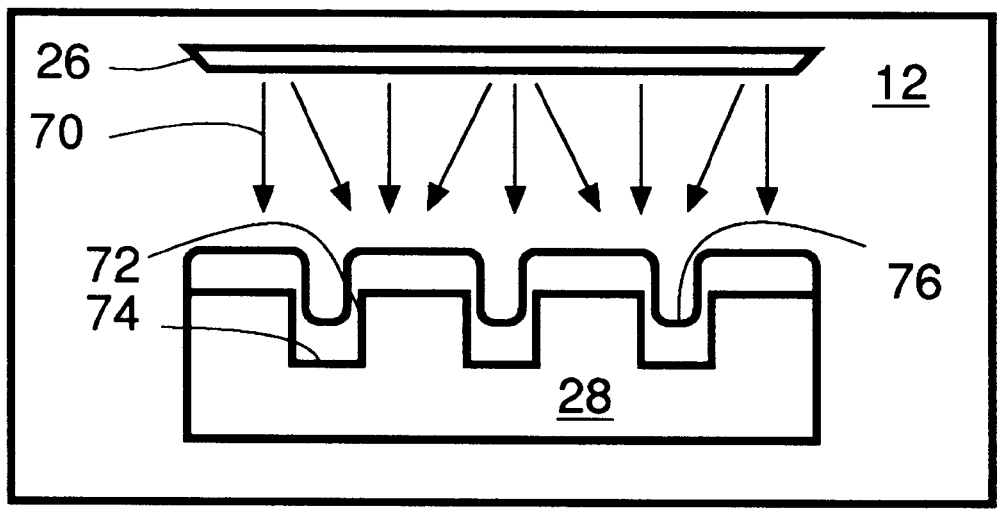
FIG. 6 is a schematic illustration of an uncollimated sputtering step of the method of FIG. 4.

The uncollimated sputtering of step 96 is represented in FIG. 6. Atoms with both oblique trajectories and with vertical trajectories are deposited on wafer 26. Thus, aperture sidewalls 74 are built up. However, because of the prior collimated sputtering, this build up does not occlude the buildup of aperture bases 74. Thus, vias and contacts of high integrity are provided with good fabrication throughput and with chances of contamination and breakage minimized.

Other embodiments of the invention provide for more position monitors to more precisely monitor collimator position. Position monitors with greater numbers of detectors can be used to distinguish more levels per position. This allows greater range and greater precision for height regulation.

In an alternative embodiment, separate transmitting and return optical paths are provided. The return paths begin on the side opposite the side of the runner that the transmitting paths end. The runner blocks light from the return paths at its level and above. Light is detected by those detectors "looking" at levels below the runner.

In addition, the number and positioning of the electromagnets and the permanent magnets can be varied. For example, instead of having two series of lateral electromagnets per guide, only one series can be used per guide; for example, the two outer series of electromagnets can be omitted. In this case, opposing forces are provided by the complementary series of electromagnets on the opposing guide. These and other modifications to and variations upon the preferred embodiments are provided for by the present invention, the scope of which is limited only by the following claims.

What is claimed is:

1. A system for sputtering material on a substrate, said system comprising:
    a chamber for establishing and confining a plasma;
    a target holder for holding a target of material to be sputtered within said chamber;
    a wafer holder for holding a wafer on which said material is to be sputtered, said wafer being held within said chamber;
    a collimator for blocking atoms moving relatively obliquely toward said wafer and permitting atoms moving relatively orthogonal to said wafer to reach said wafer, said atoms being of said material and being dislodged from said target by said plasma;
    drive means for moving and removing said collimator into and out of a position between said target and said wafer; and
    orientation means for orienting said collimator when said collimator is between said target and said wafer so that the average trajectory of atoms being deposited on said wafer is substantially orthogonal to said wafer, said orientation means including
        orientation detection means for detecting when said collimator is not properly oriented, and
        orientation correction means for adjusting the orientation to the proper orientation in response to an indication from said orientation detection means that said collimator is not properly oriented;
    whereby,
        when said collimator is not between said target and said wafer, atoms with relatively oblique trajectories and atoms with relatively orthogonal trajectories are deposited on said wafer, and
        when said collimator is between said target and said wafer, a greater proportion of the atoms deposited on said wafer arrive with orthogonal trajectories.

2. A system for sputtering material on a substrate, said system comprising:
    a chamber for establishing and confining a plasma;
    a target holder for holding a target of material to be sputtered within said chamber;
    a wafer holder for holding a wafer on which said material is to be sputtered, said wafer being held within said chamber;
    a collimator for blocking atoms moving relatively obliquely toward said wafer and permitting atoms moving relatively orthogonal to said wafer to reach said wafer, said atoms being of said material and being dislodged from said target by said plasma;
    drive means for moving and removing said collimator into and out of a position between said target and said wafer; and
    orientation means for orienting said collimator when said collimator is between said target and said wafer so that the average trajectory of atoms being deposited on said wafer is substantially orthogonal to said wafer, said orientation means including
        permanent magnet means for providing a permanent magnetic field, said permanent magnet means including at least one permanent magnet rigidly coupled to said collimator; and
        electromagnetic means for providing a current-induced magnetic field, said electromagnetic means including at least one electromagnet arranged with respect to said permanent magnet means so that the orientation of said collimator can be adjusted by changing the magnetic field of said electromagnetic means;
    whereby,
        when said collimator is not between said target and said wafer, atoms with relatively oblique trajectories and atoms with relatively orthogonal trajectories are deposited on said wafer, and
        when said collimator is between said target and said wafer, a greater proportion of the atoms deposited on said wafer arrive with orthogonal trajectories.

3. A system as recited in claim 2 wherein said collimator is not mechanically coupled to said chamber.

4. A system for sputtering material on a substrate, said system comprising:
    a chamber for establishing and confining a plasma;
    a target holder for holding a target of material to be sputtered within said chamber;
    a wafer holder for holding a wafer on which said material is to be sputtered, said wafer being held within said chamber;
    a collimator for blocking atoms moving relatively obliquely toward said wafer and permitting atoms moving relatively orthogonal to said wafer to reach said wafer, said atoms being of said material and being dislodged from said target by said plasma; and
    drive means for moving and removing said collimator into and out of a position between said target and said wafer; said drive means including permanent magnet means for providing a permanent magnetic field, said permanent magnet means being rigidly coupled to said collimator; and magnetic motion means for establishing a moving magnetic field that interacts with said permanent magnet means so as to move said collimator into and out of a position between said target and said wafer; whereby, when said collimator is not between said target and said wafer, atoms with relatively oblique trajectories and atoms with relatively orthogonal trajectories are deposited on said wafer, and when said collimator is between said target and said wafer, a greater proportion of the atoms deposited on said wafer arrive with orthogonal trajectories.

5. A method of sputtering a material on a wafer, said method comprising the steps of:

detecting the orientation of a collimator;

adjusting the orientation of said collimator so that the trajectories of atoms to be deposited on said wafer are substantially orthogonal to said wafer;

sputtering through said collimator a material from a target onto a wafer;

removing said collimator from between said target and said wafer; and while said collimator is removed, sputtering said material from said target onto said wafer.

6. A method as recited in claim 5 wherein said adjusting step involves adjusting magnetic fields affecting permanent magnets rigidly coupled to said collimator.

7. A method of sputtering a material on a wafer, said method comprising the steps of:

sputtering through a collimator a material from a target onto a wafer;

removing said collimator from between said target and said wafer by applying magnetic fields to permanent magnets rigidly coupled to said collimator; and while said collimator is removed, sputtering said material from said target onto said wafer.

* * * * *